(12) United States Patent
Mukougawa

(10) Patent No.: US 7,091,413 B2
(45) Date of Patent: Aug. 15, 2006

(54) ELECTRICAL EQUIPMENT WITH CHASSIS LATCHED ON CABINET BOTTOM SURFACE

(75) Inventor: Hidenobu Mukougawa, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 28 days.

(21) Appl. No.: 10/974,673

(22) Filed: Oct. 28, 2004

(65) Prior Publication Data

US 2005/0094380 A1    May 5, 2005

(30) Foreign Application Priority Data

Oct. 30, 2003    (JP) .............................. 2003-370189

(51) Int. Cl.
*H02G 3/08* (2006.01)
(52) U.S. Cl. ............................ 174/50; 174/58; 174/60; 174/63; 174/64; 312/223.1
(58) Field of Classification Search ................. 174/50, 174/60, 64, 58, 63; 361/685, 683; 312/223.1, 312/265.6; 220/4.31, 4.02
See application file for complete search history.

(56) References Cited

U.S. PATENT DOCUMENTS 6,853,549 B1 * 2/2005 Xu .............................. 361/685
6,930,247 B1 * 8/2005 Chen et al. ..................... 174/50
6,951,979 B1 * 10/2005 Omura et al. .................. 174/50
6,956,737 B1 * 10/2005 Chen et al. ................. 361/685
6,972,960 B1 * 12/2005 Ecker et al. ................. 361/724

FOREIGN PATENT DOCUMENTS

JP    11-40957    2/1999
JP    2003-198153    7/2003

* cited by examiner

*Primary Examiner*—Dhiru R. Patel
(74) *Attorney, Agent, or Firm*—Wenderoth, Lind & Ponack, L.L.P.

(57) ABSTRACT

Electrical equipment having a chassis with electronic parts mounted thereto can be simply mounted on a bottom of a cabinet without using screws and can be simply disassembled. A plurality of hooks are provided on a bottom plate of the cabinet. The chassis is formed with holes to permit the hooks to engage therewith. A positioning projection is provided on the bottom plate of the cabinet or on the chassis to afford flexible deformation, and a latch hole is provided on the chassis or on the bottom plate of the cabinet to permit the positioning projection to be latched thereon.

4 Claims, 8 Drawing Sheets

ELECTRICAL EQUIPMENT WITH CHASSIS LATCHED ON CABINET BOTTOM SURFACE

BACKGROUND OF THE INVENTION

1. Field of the Invention

The present invention relates to electrical equipment, in which a chassis, having a substrate, condensers and other electronic parts mounted thereto, is mounted on a bottom surface of a cabinet without screwing.

2. Related Art

Electrical equipment such as disk drives, video equipment, etc. has various electronic parts mounted on a chassis and housed in a cabinet capable of covering the exterior thereof in this state. In this case, while screwing is conventionally used as a means for fixing the chassis to the cabinet, several screws are generally needed to achieve such screwing.

The work of screwing these respective screws into threaded holes is troublesome and takes many manhours, which causes an increase in cost of the electrical equipment. Further, screwing necessitates positioning of a chassis and the chassis must be set in a position affording insertion and screwing of screws, so that an increase in manhours is brought about because such positioning work is also troublesome.

JP-A-11-40957 entitled "Chassis structure of electrical equipment" discloses that a chassis is screwed onto a cabinet bottom surface through a mount piece and an inner casing is screwed onto the chassis through a connection member.

JP-A-2003-198153 entitled "Mount construction of electrical equipment" discloses that mounting and dismounting a unit to and from an equipment body can be performed very easily without using screws and tools for a reduction in manhours. More specifically, the unit is put on a base chassis, which includes an abutment surface to abut against a side of the unit, and a slide bracket is slid along a guide rail provided on a lower portion of the chassis until a projection on the bracket engages with an engagement hole of the chassis. Upon completion of such engagement, an elastic spring of the bracket abuts against the other side of the unit, and the elastic spring and the abutment surface of the chassis interpose therebetween the unit to fix the same.

No screws are needed in mounting of the unit with the use of the mount construction. However, the base chassis and the slide bracket are necessary, and accordingly the total manufacturing cost is never made inexpensive.

On the other hand, used electrical equipment cannot be discarded as it is because of environmental factors and savings of resources, and the members included in the equipment must be separated according to their materials for recycling. At this time, it is essentially required that the work of separation be simple. Accordingly, it is demanded of electrical equipment that it not only can be simply assembled with fewer manhours but also can be easily disassembled and separated into respective materials.

In this manner, the problems described above are involved in the conventional chassis mount construction. The present invention solves these problems and provides electrical equipment capable of mounting a chassis on a bottom of a cabinet without screwing for simple mounting and disassembling to achieve recycling.

SUMMARY OF THE INVENTION

Electrical equipment having a chassis with electronic parts mounted thereto is mounted inside a cabinet without using screws. A plurality of hooks are provided on a bottom plate of the cabinet. Holes are formed on the chassis to permit the hooks to engage therewith. A positioning projection is provided on the bottom plate of the cabinet or on the chassis to afford flexible deformation. A latch hole is provided on the chassis or on the bottom plate of the cabinet to permit the positioning projection to be latched therewith, whereby the chassis is latched on a bottom surface of the cabinet.

The hooks may be formed to stand up from the bottom plate of the cabinet and to be L-shaped with tip ends thereof bent forward at a right angle. The cabinet may be provided on a back plate thereof with a horizontally forwardly extending engagement piece. The chassis may be provided on a back plate thereof with a slit, with which the engagement piece engages.

With the electrical equipment according to the invention, the chassis is put on the bottom plate of the cabinet and slid thereon to cause the hooks provided on the bottom plate of the cabinet to engage with the holes formed on the chassis, and the positioning projection provided on the bottom plate of the cabinet or on the chassis is latched on the hole of the chassis or of the bottom plate of the cabinet, whereby the chassis is connected and fixed to the bottom plate of the cabinet. Thus, the chassis is simply mounted to the bottom plate of the cabinet without the use of screws.

On the other hand, by removing or releasing the positioning projection provided on the bottom plate of the cabinet or on the chassis, the chassis can be simply separated from the cabinet, which comes in useful in disassembling to discard and recycle components.

DETAILED DESCRIPTION OF PREFERRED EMBODIMENT

Figure 1:
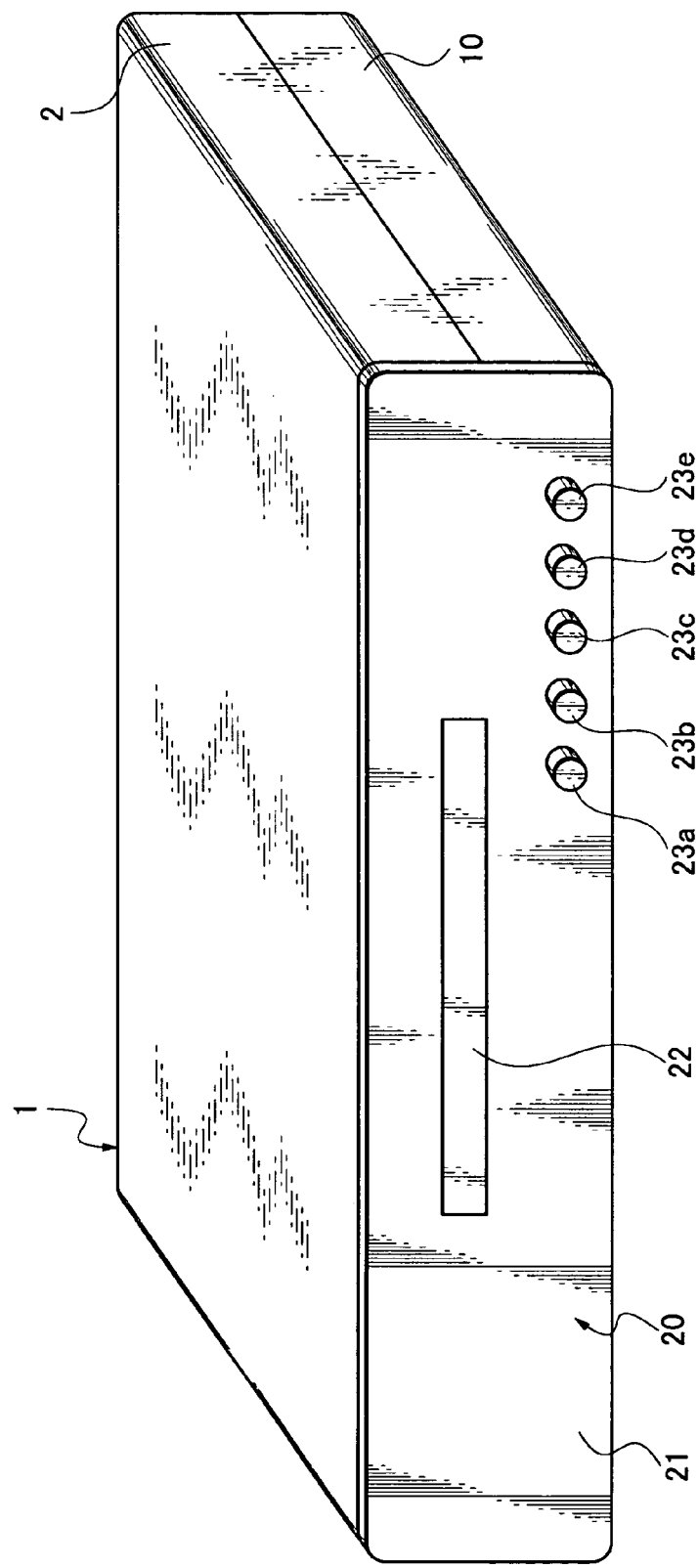
FIG. 1 is a perspective view showing a disk drive according to an embodiment of the invention.

FIG. 1 shows the outward appearance of a disk drive according to an embodiment of the invention, which includes a cabinet 1 composed of an upper casing 2 and a lower casing 10, and a front panel 20. The front panel 20 is provided with a tray carrying-in and carrying-out port 22 through which a tray enters and exits, and a plurality of push buttons 23a, 23b, .... Among the push buttons 23a, 23b, ... in the disk drive, the push button 23a functions as a reproduction button, the push button 23b functions as a quick feed button, the push button 23c functions as a quick return button, the push button 23d functions as a skip button, and the push button 23e functions as a tray carrying-out button.

A face plate 21 is stuck to a front surface of the front panel 20 and has the same size as the front surface of the front panel 20 to cover front edges of the cabinet 1, as shown in the figure, thus improving the decorativeness of the front design of the disk drive.

The front panel 20 with the face plate 21 stuck to the front surface thereof must be exactly positioned on a front opening of the cabinet 1 and mounted thereto. A mount frame 24 fitted into a cabinet opening is provided on the back surface of the front panel 20 to achieve positioning in order to prevent generation of positional shift and difference in level between the front panel 20 and the cabinet opening.

Figure 2:
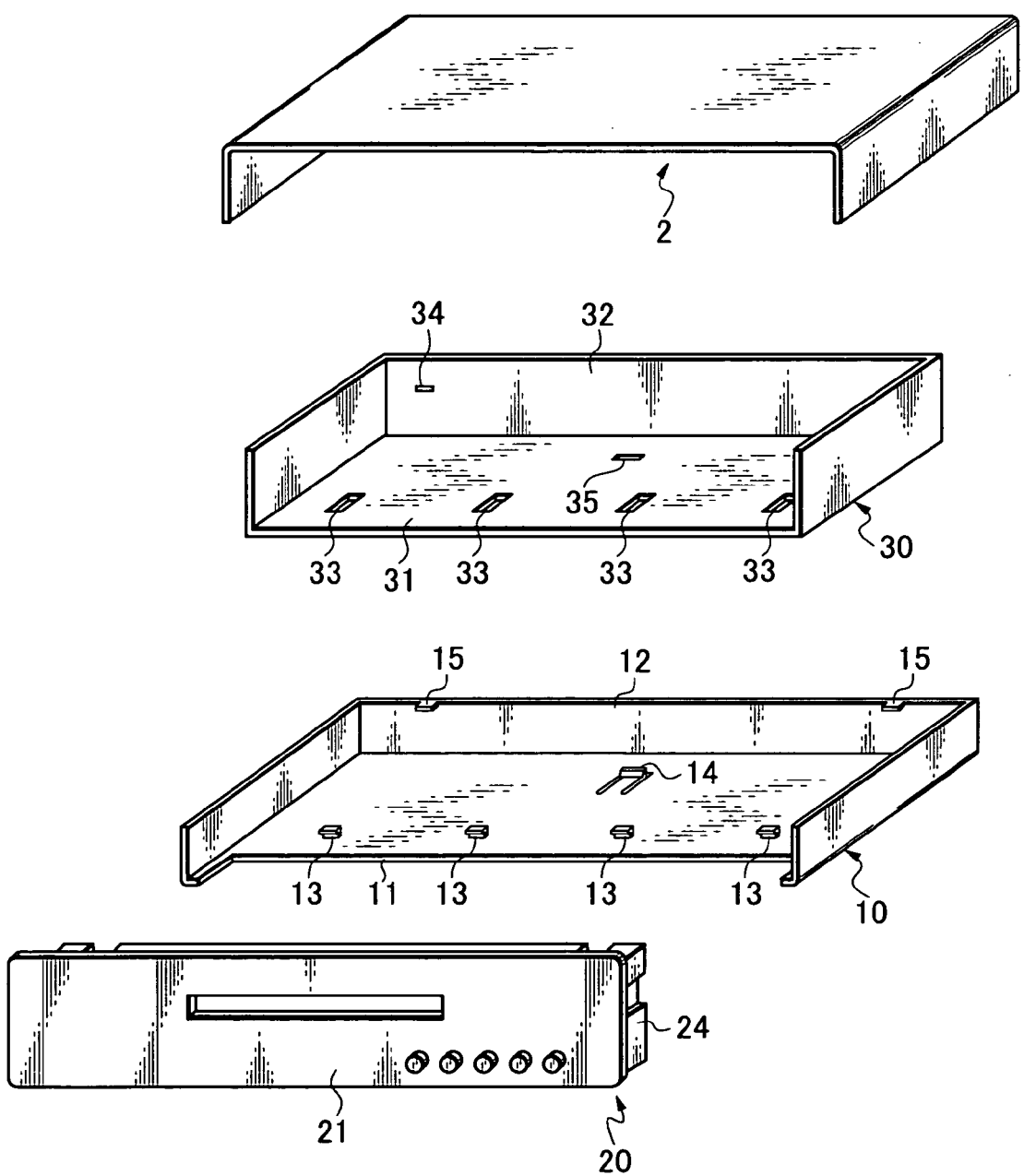
FIG. 2 is an exploded perspective view showing a cabinet, a front panel, and a chassis of the disk drive.

As shown in FIG. 2, the present disk drive is disassembled into the upper casing 2, the lower casing 10, the front panel 20, and a chassis 30. In assembling the present disk drive, the chassis 30 is first mounted on a bottom plate of the cabinet 1, that is, a bottom plate 11 of the lower casing 10 without using screws. The front panel 20 is then mounted, and finally the upper casing 2 is mounted.

Figure 3A:
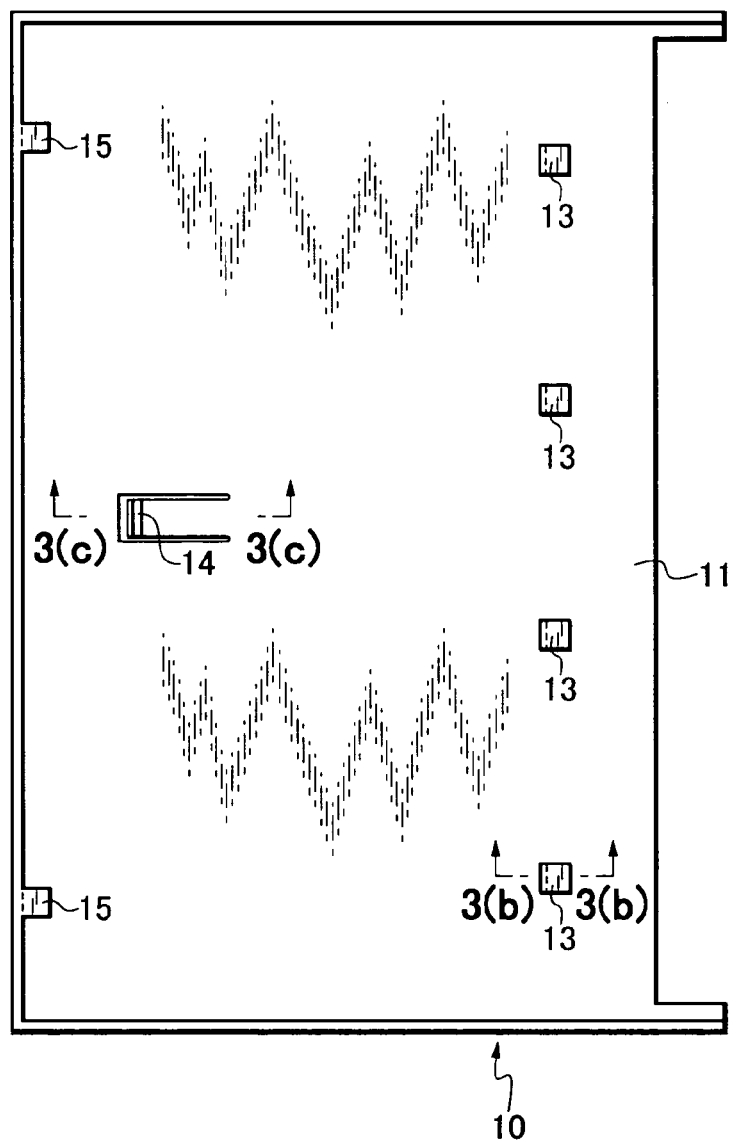
FIG. 3(a) is a plan view showing a lower casing of the disk drive.

As shown in FIG. 3(a), four L-shaped upright hooks 13, 13, ... are provided on the bottom plate 11 of the lower casing 10, and four rectangular-shaped holes 33, 33, ... affording insertion of the hooks 13 therethrough are formed on a corresponding bottom plate 31 of the chassis 30. Two engagement pieces 15, 15 extending horizontally inward are provided on an upper end of a back plate 12 of the lower casing 10, and slits 34, 34 affording insertion of the engagement pieces 15, 15 therethrough are formed on a corresponding back plate 32 of the chassis 30. Further, a positioning projection 14 affording flexible deformation is provided centrally of the bottom plate 11 of the lower casing 10 and toward a back surface thereof, and a latch hole 35 is formed in a corresponding position on the bottom plate 31 of the chassis 30.

Figure 3B:
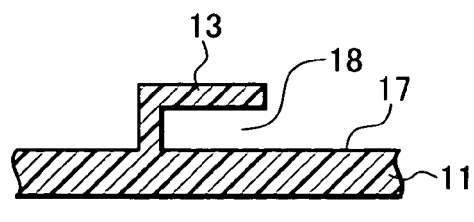
FIG. 3(b) is an enlarged cross sectional view taken along the line 3(b)—3(b) in FIG. 3(a)

As shown in FIG. 3(b), the hooks 13 of the lower casing 10 stand up from the bottom plate 11 in a L-shaped manner, and a gap 18 between the respective hooks and a bottom surface 17 is sized to correspond to a thickness of the bottom plate 31 of the chassis 30. When the chassis 30 is caused to slide with the hooks 13 fitted into the holes 33, edges of the holes 33 fittingly engage with the gaps 18.

Figure 3C:
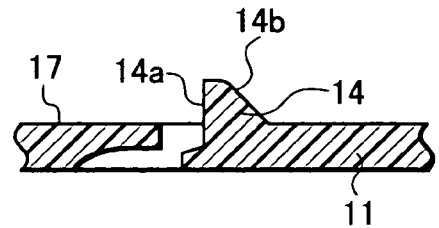
FIG. 3(c) is an enlarged cross sectional view taken along the line 3(c)—3(c) in FIG. 3(a)

As shown in FIG. 3(c), the positioning projection 14 has a tip end having a substantially right triangle cross section, and has a vertically upright latch surface 14a on a back surface side and an inclined surface 14b on a front side. The positioning projection 14 affords flexible deformation and normally projects upward from the bottom surface 17. When the chassis 30 is put on the bottom plate 11, the positioning projection 14 is pushed by the bottom plate 31 to flex downward, and when sliding to be fitted into the latch hole 35, the positioning projection 14 is returned elastically upward to have the latch surface 14a thereof latched on an edge of the latch hole 35. Accordingly, the chassis 30 is positioned and cannot slide back to an original position thereof.

Figure 4:
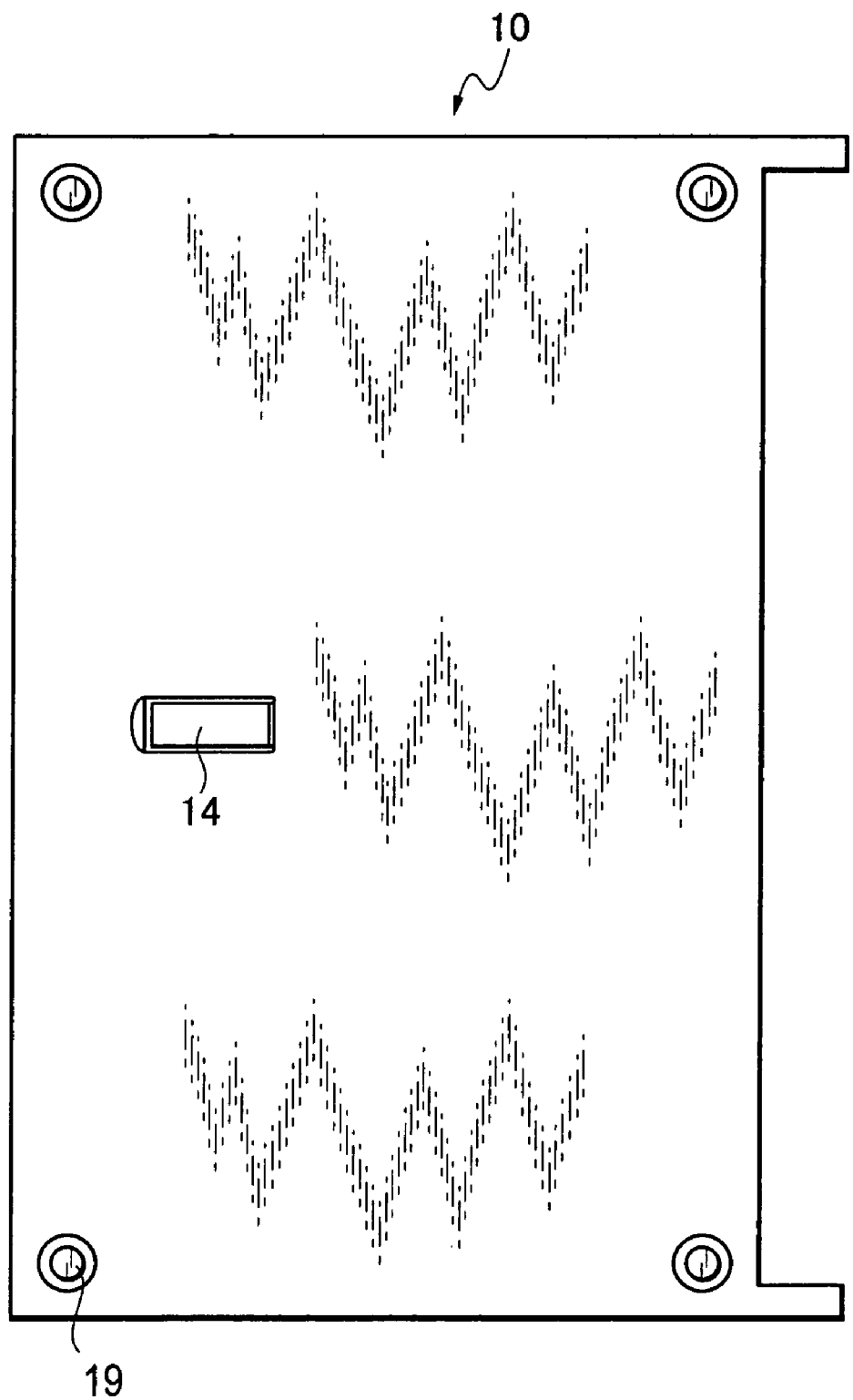
FIG. 4 is a bottom view showing the lower casing.

As shown in FIG. 4, the lower casing 10 has legs 19, 19 ... at four corners on a bottom surface thereof and has the positioning projection 14 centrally thereof and toward the back surface thereof. The positioning projection 14 can be removed or released from the bottom surface, and when the positioning projection is removed or released, the chassis 30 can be readily separated from the lower casing 10. More specifically, when the positioning projection 14 is removed or released to permit the chassis 30 to slide forward, the chassis 30 is disengaged from the hooks 13, 13, ... and the engagement slits 15, 15 to be separated therefrom. The positioning projection 14 can be removed or released by inserting an appropriate tool through the gap.

Figure 5A:
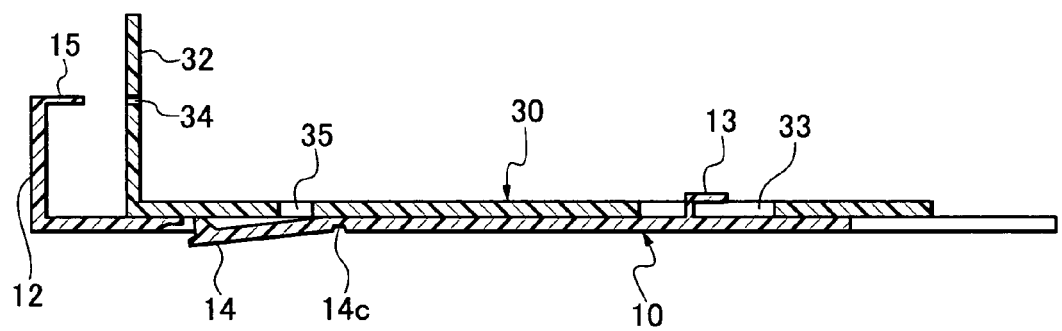
FIG. 5(a) is a vertical cross sectional view illustrating a procedure of latching the chassis on the lower casing for mounting.

In case of mounting the chassis 30 on the lower casing 10, the chassis 30 is first put on the bottom plate 11 of the lower casing 10 as shown in FIG. 5(a) and the hooks 13, 13, ... are fitted into the holes 33, 33, ... formed on the bottom plate 31 of the chassis 30. At this time, the positioning projection 14 is pushed down by the bottom plate 31 of the chassis 30 to flex downward. A groove 14c is formed transversely on a base of the positioning projection 14 toward the bottom surface, so that the positioning projection 14 is made able to flex downward and can be readily broken off from the groove 14c when strongly pulled.

Figure 5B:
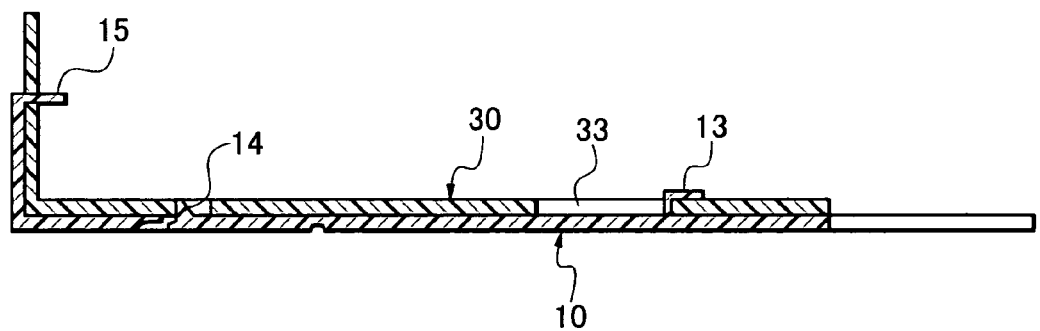
FIG. 5(b) is a vertical cross sectional view illustrating a state in which the chassis is mounted on the lower casing.
Figure 6:
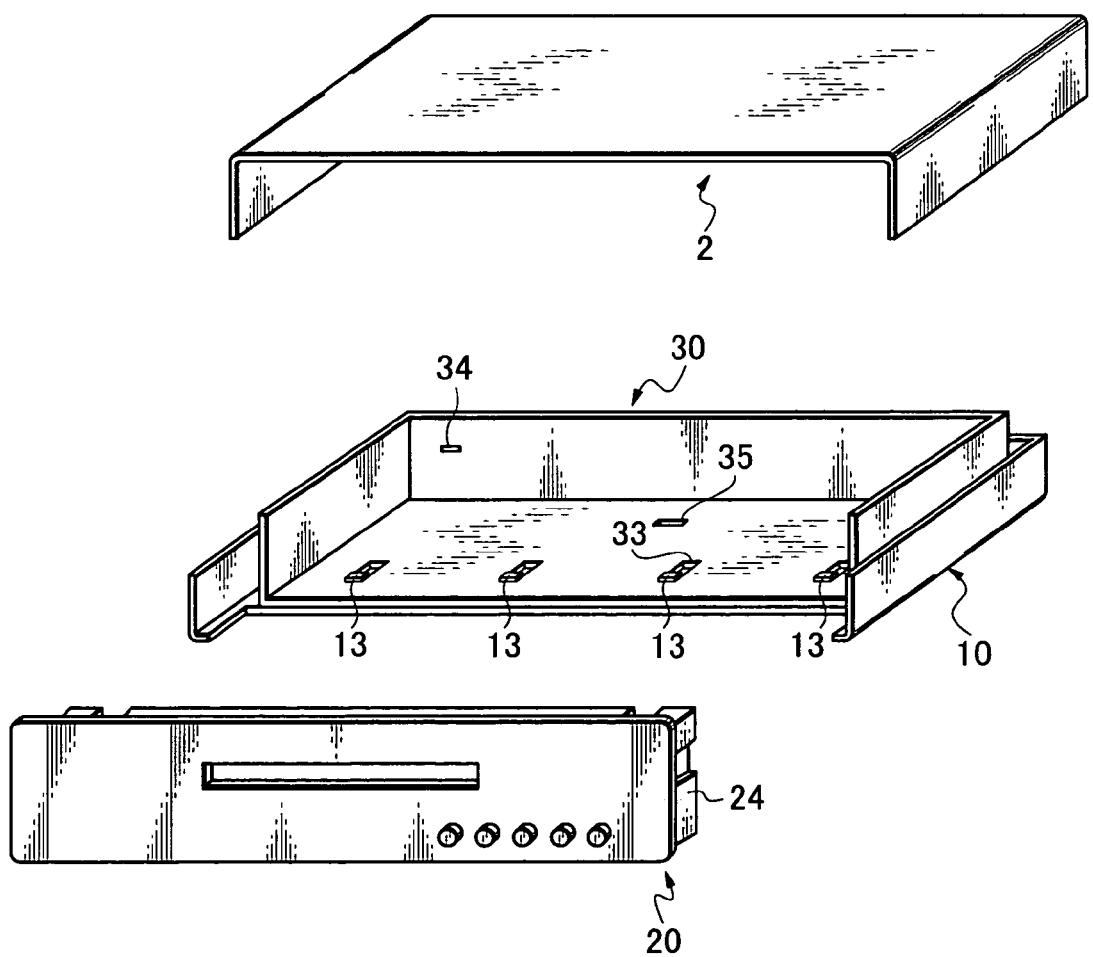
FIG. 6 is an exploded perspective view showing a state in which the chassis is mounted on the lower casing.

Subsequently, when the chassis 30 is caused to slide rearward toward the back plate 12 of the lower casing 10, the respective L-shaped upright hooks 13, 13, ... are latched on the edges of the holes 33 and simultaneously the engagement pieces 15 are fitted in the slits 34 formed on the back plate 32. Further, the positioning projection 14 is returned elastically upward to be latched on the latch hole 35 (see FIGS. 5(b) and 6). When the positioning projection 14 is once latched on the latch hole 35 in this manner, the chassis 30 cannot be slid and separated from the lower casing 10 unless the positioning projection 14 is disengaged from the latch hole 35.

Figure 7A:
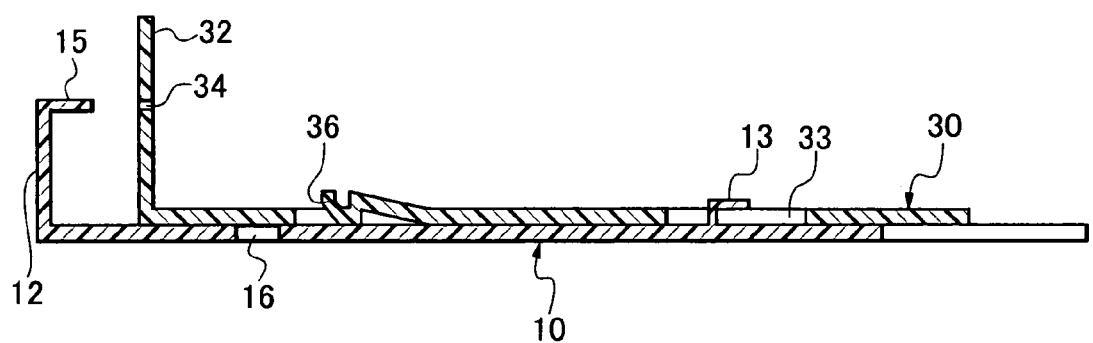
FIGS. 7(a) and 7(b) are vertical cross sectional views illustrating another mode of the chassis and the lower casing.
Figure 7B:
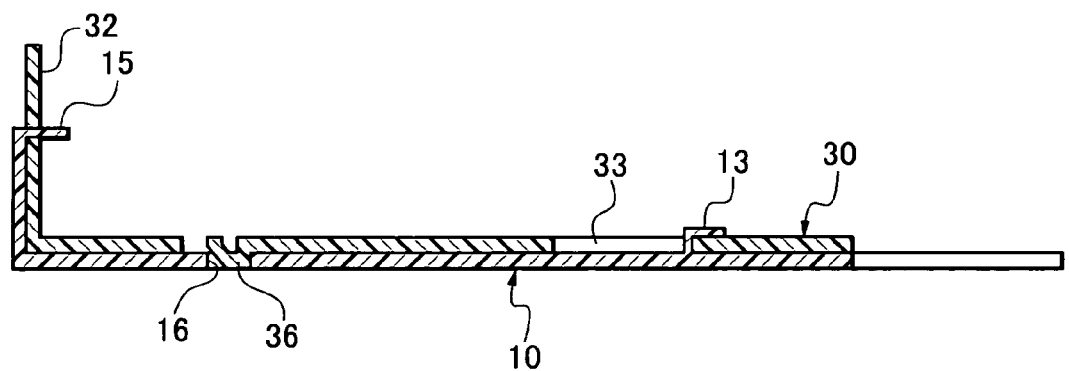

The above positioning projection and the latch hole in which the positioning projection is fitted may be constructed as shown in FIGS. 7(a) and 7(b), wherein a positioning projection 36 is formed on the chassis 30 and a latch hole 16 in which the positioning projection 36 be fitted are formed on the bottom plate of the cabinet 1. The functions are as same as with the case where the positioning projection is formed on the bottom plate of the cabinet, and accordingly further description is omitted.

Figure 8A:
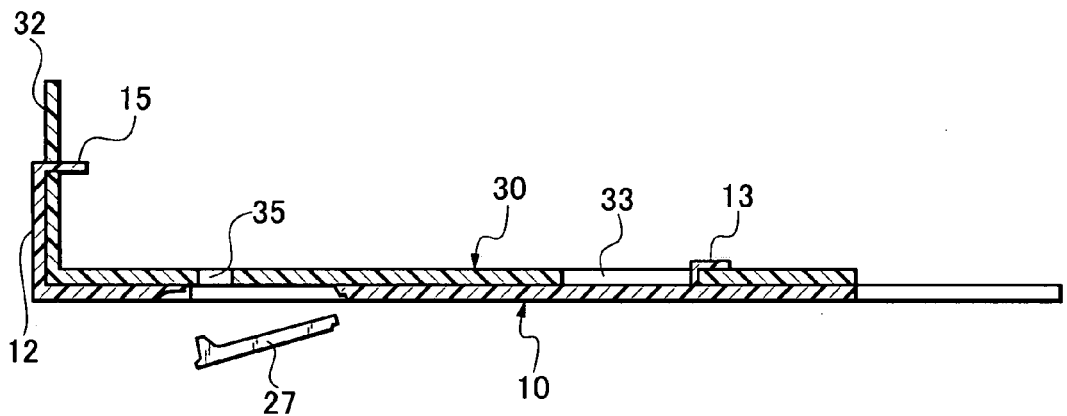
FIGS. 8(a) and 8(b), are vertical cross sectional views each illustrating a process in which the chassis is separated from the lower casing.
Figure 8B:
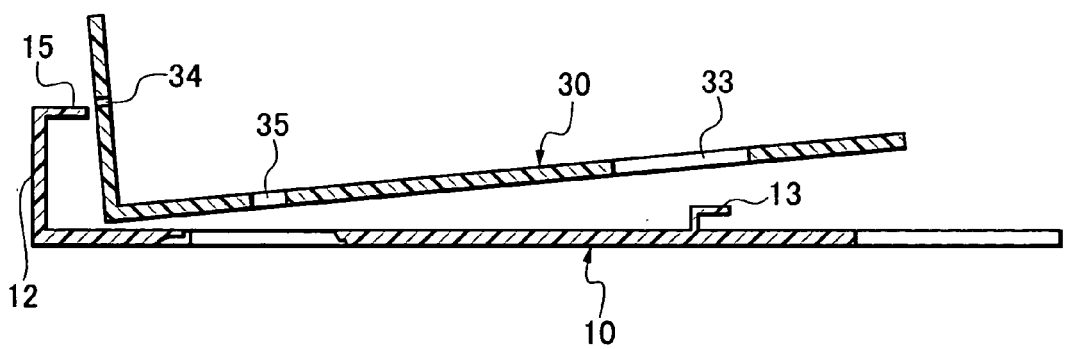

In case of separating the chassis 30 from the lower casing 10, the positioning projection 14 is first bent at the groove 14c to be removed from the bottom plate 11 as shown in FIG. 8(a). When the positioning projection 14 is removed, the hooks 13 are disengaged from the holes 33 by drawing the chassis 30 forward, while simultaneously the engagement pieces 15 are disengaged from the slits 34 and separated from the lower casing 10 (see FIG. 8(b)). Of course, the chassis 30 may be drawn and separated in such a manner that the positioning projection 14 is not removed but is appropriately flexibly deformed to release latch and disengaged from the latch hole 35.

What is claimed is:

1. Electrical equipment in which a chassis having electronic parts mounted thereto is mounted inside a cabinet without using screws, comprising:

a plurality of hooks provided on a bottom plate of the cabinet;

holes formed on a bottom plate of the chassis so as to permit the hooks to engage therewith;

a positioning projection provided on one of the bottom plate of the cabinet and the bottom plate of the chassis so as to be flexibly deformable; and a latch hole provided on the other of the bottom plate of the cabinet and the bottom plate of the chassis so as to permit the positioning projection to be latched therewith, whereby the chassis is latched with the cabinet.

2. The electrical equipment of claim 1, wherein:

the hooks stand from the bottom plate of the cabinet and are L-shaped with tip ends thereof bent forward at a right angle;

the cabinet has a back plate with a horizontally forwardly extending engagement piece; and the chassis has a back plate having a slit for engagement by the engagement piece.

3. Electrical equipment mounting structure, comprising:

a cabinet having a bottom plate;

a chassis for having electronic parts mounted thereto and for mounting inside the cabinet without using screws;

a plurality of hooks provided on a bottom plate of the cabinet;

holes formed on a bottom plate of the chassis so as to permit the hooks to engage therewith;

a positioning projection provided on one of the bottom plate of the cabinet and the bottom plate of the chassis so as to be flexibly deformable; and a latch hole provided on the other of the bottom plate of the cabinet and the bottom plate of the chassis so as to permit the positioning projection to be latched therewith, whereby the chassis can be latched with the cabinet.

4. The electrical equipment of claim 3, wherein:

the hooks stand from the bottom plate of the cabinet and are L-shaped with tip ends thereof bent forward at a right angle;

the cabinet has a back plate with a horizontally forwardly extending engagement piece; and the chassis has a back plate having a slit for engagement by the engagement piece.

* * * * *